United States Patent
Parker et al.

(10) Patent No.: US 9,804,475 B1
(45) Date of Patent: Oct. 31, 2017

(54) RADIO-FREQUENCY LOSS REDUCTION IN PHOTONIC CIRCUITS

(71) Applicants: John Parker, Goleta, CA (US); Gregory Alan Fish, Santa Barbara, CA (US); Brian R. Koch, San Carlos, CA (US)

(72) Inventors: John Parker, Goleta, CA (US); Gregory Alan Fish, Santa Barbara, CA (US); Brian R. Koch, San Carlos, CA (US)

(73) Assignee: Aurrion, Inc., Goleta, CA (US)

(*) Notice: Subject to any disclaimer, the term of this patent is extended or adjusted under 35 U.S.C. 154(b) by 30 days.

(21) Appl. No.: 15/130,156

(22) Filed: Apr. 15, 2016

Related U.S. Application Data

(60) Provisional application No. 62/148,353, filed on Apr. 16, 2015.

(51) Int. Cl.
    *G02F 1/035* (2006.01)
    *G02F 1/225* (2006.01)
    *H01L 27/146* (2006.01)
    *H01L 31/18* (2006.01)

(52) U.S. Cl.
    CPC .......... *G02F 1/2255* (2013.01); *G02F 1/2257* (2013.01); *H01L 27/14625* (2013.01); *H01L 31/184* (2013.01)

(58) Field of Classification Search
    CPC ................. G02F 1/2255; G02F 1/2257; H01L 27/14625; H01L 31/184
    See application file for complete search history.

(56) References Cited

U.S. PATENT DOCUMENTS

| | | | | |
|---|---|---|---|---|
| 6,545,791 | B1* | 4/2003 | McCaughan | G02F 1/03 359/237 |
| 6,734,755 | B2* | 5/2004 | Cites | H01P 5/08 333/26 |
| 7,184,627 | B1* | 2/2007 | Gunn, III | G02B 6/12004 359/34 |
| 7,218,799 | B2* | 5/2007 | Deliwala | G02F 1/011 385/1 |
| 7,257,283 | B1* | 8/2007 | Liu | G02B 6/12004 385/14 |

(Continued)

FOREIGN PATENT DOCUMENTS

| WO | WO 2014200920 | * 12/2014 | ............ G02F 1/025 |
|---|---|---|---|

OTHER PUBLICATIONS 12.5 Gb/s operation w 0.29-V*cmVpiL using silicon Mach-Zehnder modulator based on forward biased pin diode by Akiyama et al; published by OPtics Express Jan. 30, 2012, vol. 20, No. 3, pp. 2911-2923.*

*Primary Examiner* — Ryan Lepisto
*Assistant Examiner* — Guy Anderson
(74) *Attorney, Agent, or Firm* — Schwegman Lundberg & Woessner, P.A.

(57) ABSTRACT

In photonic integrated circuits implemented in silicon-on-insulator substrates, non-conductive channels formed, in accordance with various embodiments, in the silicon device layer and/or the silicon handle of the substrate in regions underneath radio-frequency transmission lines of photonic devices can provide breaks in parasitic conductive layers of the substrate, thereby reducing radio-frequency substrate losses.

5 Claims, 13 Drawing Sheets

(56) References Cited

U.S. PATENT DOCUMENTS

| | | | | |
|---|---|---|---|---|
| 7,751,658 B2* | 7/2010 | Welch | H01S 5/026 | 385/14 |
| 8,290,014 B2* | 10/2012 | Junesand | H01S 5/021 | 372/50.1 |
| 8,538,206 B1* | 9/2013 | Fish | G02F 1/025 | 385/2 |
| 8,582,927 B1* | 11/2013 | Thaniyavarn | G02F 1/0356 | 385/2 |
| 8,582,929 B2* | 11/2013 | Yi | G02F 1/2257 | 385/10 |
| 8,605,766 B2* | 12/2013 | Dallesasse | H01S 5/021 | 372/20 |
| 8,744,219 B2* | 6/2014 | Kato | G02F 1/0327 | 385/3 |
| 8,774,582 B1* | 7/2014 | Jacob-Mitos | H01S 5/22 | 385/131 |
| 8,781,283 B1* | 7/2014 | Fang | H01S 5/021 | 385/131 |
| 8,787,417 B2* | 7/2014 | Baets | B82Y 20/00 | 372/1 |
| 8,867,578 B2* | 10/2014 | Dallesasse | H01S 5/021 | 372/102 |
| 8,891,913 B1* | 11/2014 | Roth | G02B 6/12002 | 385/14 |
| 9,293,448 B2* | 3/2016 | Nguyen | | |
| 2001/0007601 A1* | 7/2001 | Kondo | G02F 1/035 | 385/2 |
| 2002/0126932 A1* | 9/2002 | Minakata | G02F 1/2255 | 385/2 |
| 2004/0052442 A1* | 3/2004 | Li | B82Y 20/00 | 385/3 |
| 2007/0292073 A1* | 12/2007 | Li | G02F 1/0121 | 385/14 |
| 2009/0067771 A1* | 3/2009 | Chen | G02F 1/025 | 385/3 |
| 2010/0040322 A1* | 2/2010 | Li | G02F 1/065 | 385/3 |
| 2012/0163749 A1* | 6/2012 | Huang | G02B 6/12004 | 385/3 |
| 2012/0251032 A1* | 10/2012 | Kato | G02F 1/0327 | 385/3 |
| 2012/0301071 A1* | 11/2012 | Kung | G02F 1/0118 | 385/9 |
| 2015/0097210 A1* | 4/2015 | Krasulick | H01L 31/02327 | 257/184 |
| 2015/0098676 A1* | 4/2015 | Krasulick | G02B 6/1225 | 385/14 |
| 2015/0212346 A1* | 7/2015 | Zheng | G02F 1/025 | 398/186 |
| 2016/0109731 A1* | 4/2016 | Huang | G02F 1/015 | 385/3 |

\* cited by examiner

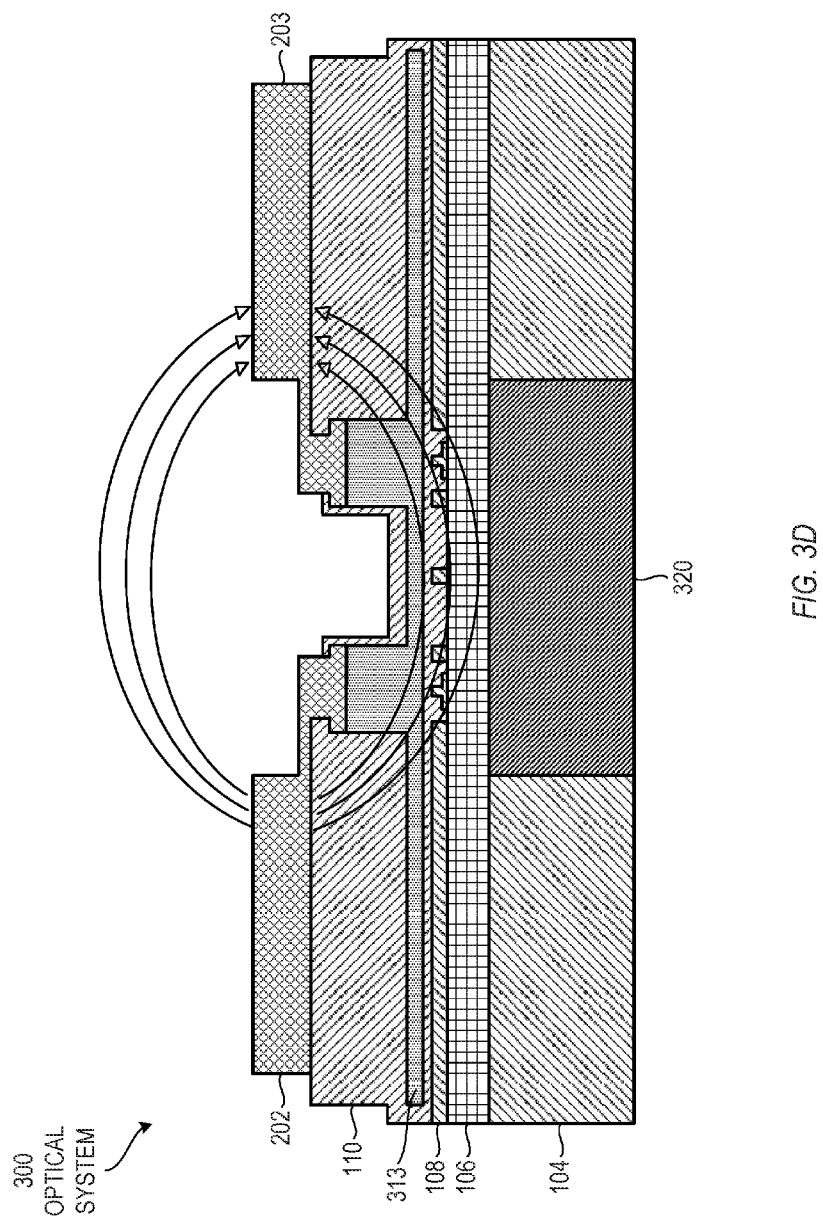

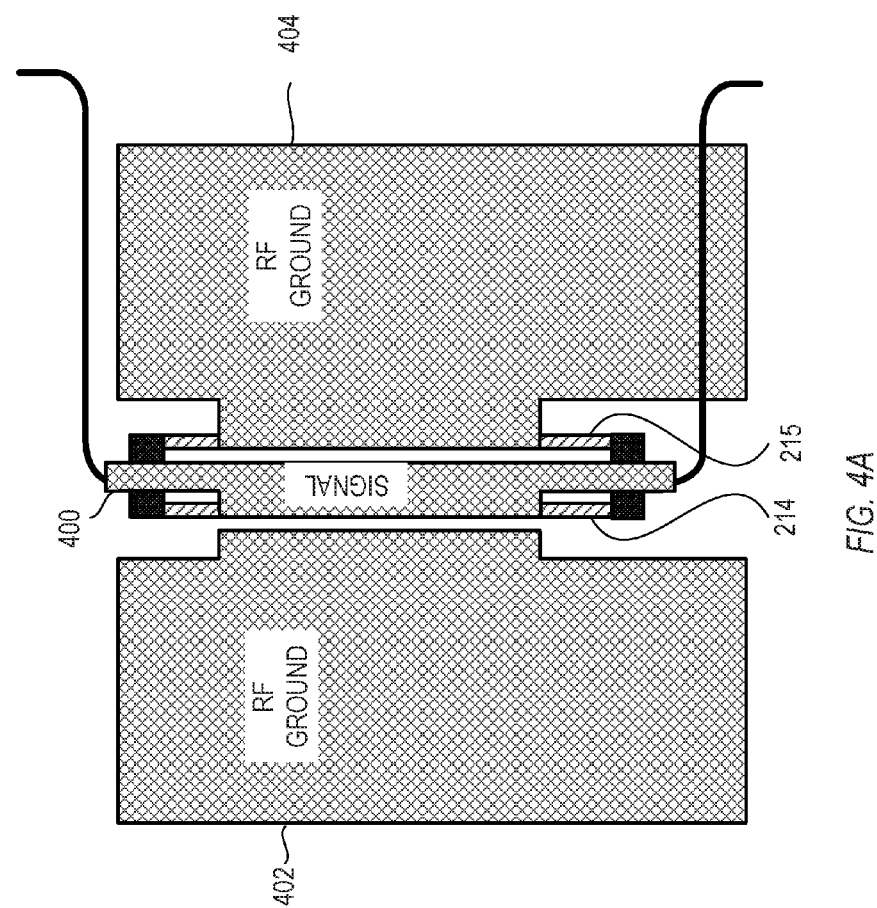

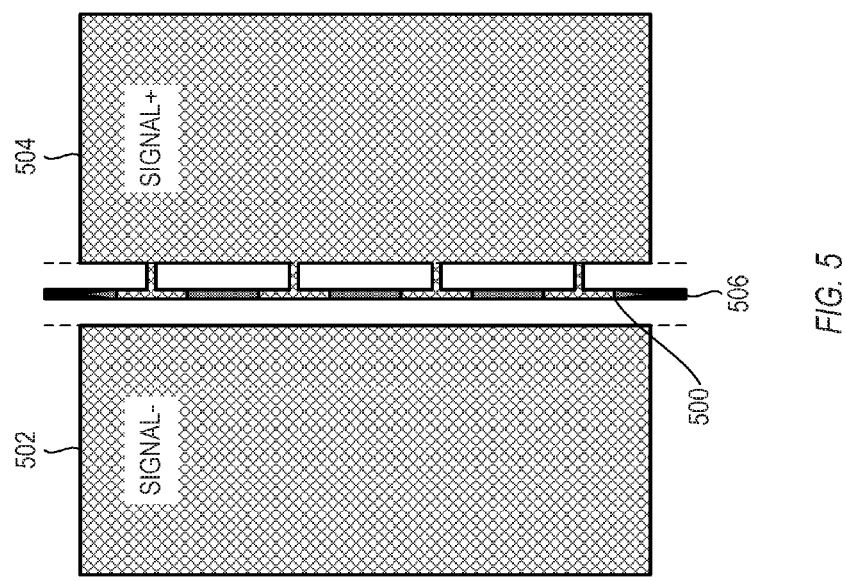

RADIO-FREQUENCY LOSS REDUCTION IN PHOTONIC CIRCUITS

CROSS-REFERENCE TO RELATED APPLICATIONS

This application claims priority to and the benefit of U.S. Provisional Application No. 62/148,353, filed on Apr. 16, 2015, which is incorporated herein by reference in its entirety.

TECHNICAL FIELD

The instant disclosure relates generally to semiconductor-wafer-bonded photonic structures, and more particularly to photonic integrated circuits and electrical radio-frequency (RF) losses therein.

BACKGROUND

Photonic integrated circuits (PICs) generally integrate multiple photonic devices and respective photonic functions in the same chip, e.g., within the device layer(s) of a silicon on insulator (SOI) substrate with bonded III-V material. One or more of the photonic devices may include metal transmission lines disposed on top of the substrate. These transmission lines, which generally operate in the radio-frequency (RF) regime, can in principle carry large amounts of data at high speeds, data transmission being subject, however, to propagation loss due, at least in part, to substrate losses.

FIG. 1 depicts, in cross-sectional view, a portion of an SOI substrate 100 with an RF transmission line 102 disposed thereon, illustrating the basic layer structure of the substrate 100 and the origin of RF losses therein. As shown, the SOI substrate 100 includes a silicon handle 104, a buried oxide (BOX) layer 106 (e.g., made substantially of silicon dioxide) thereabove, a silicon device layer 108 on top of the BOX layer 106, and, optionally, a cladding layer 110 (e.g., made of a dielectric material) above the silicon device layer 108. (In the absence of a separate cladding layer 110, air serves as the cladding.) Photonic devices (not shown) may be embedded in the silicon device layer 108 and/or the cladding layer 110. The transmission line 102 generally includes multiple metal traces (e.g., two, as shown) that function as electrodes. As an RF electrical current is applied to these electrodes, an RF electrical field that extends through the SOI substrate 100 is formed, as indicated by the field lines 112. Parasitic conductive layers 114 formed at the interfaces of the BOX layer 106 with the silicon handle 104 and with the silicon device layer 108 allow for electric currents to flow in response to the electric field, reducing its field strength and thereby contributing to the RF losses in the substrate 100; substantial losses may occur, for example, in the frequency range from about 0.1 GHz to 40 GHz or even higher. In order to enable lower propagation loss in the transmission line 102, it is desirable to find ways of reducing these substrate losses.

BRIEF DESCRIPTION OF THE DRAWINGS

FIG. 3D is a cross-sectional view of the example Mach-Zehnder modulator of FIG. 2 as implemented on an SOI substrate having a filled channel formed in the silicon handle, in accordance with one embodiment.

FIG. 4A is a top view of a Mach-Zehnder modulator with three electrodes, in accordance with one embodiment.

FIG. 5 is a top view of an example photodetector with a waveguide and including electrodes, in accordance with various embodiments.

DESCRIPTION

Figure 1:
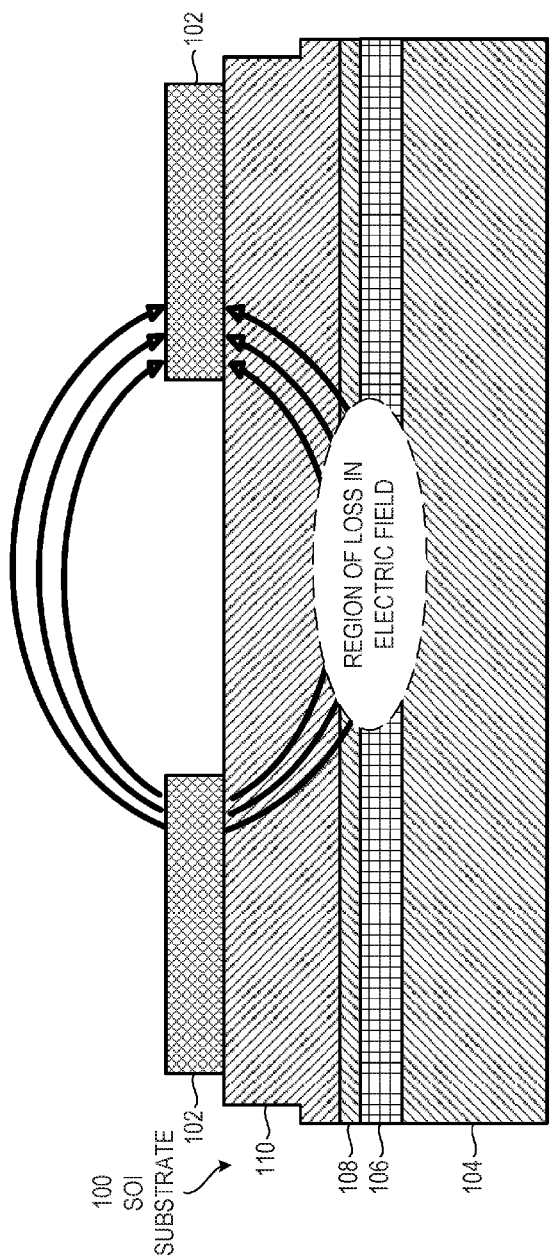
FIG. 1 is a cross-sectional view of a portion of an SOI substrate with an RF transmission line disposed thereon, illustrating the basic layer structure of the substrate and the origin of RF losses therein.

Described herein are PICs implemented in SOI substrates in which one or more nonconductive channels in the silicon device layer and/or the silicon handle provide breaks in the parasitic conductive layers, as well as methods for manufacturing such PICs. In accordance with various embodiments, the channels are formed in regions underneath a transmission line, each channel laterally at least partially overlapping with a gap defined between two adjacent electrodes of the transmission line so as to prevent lateral current flow between the electrodes. The channels do not extend laterally beyond the outer edges of the respective electrodes defining the gap, and each channel is, thus, confined to a region encompassing only a single one of generally multiple photonic devices included in the PIC. (The terms "outer edge" and "inner edge" are used with reference to the gap between two adjacent electrodes. The inner edge of an electrode defines one of the boundaries of the gap, and the outer edge is the other edge of that electrode, which is more distant from the gap. The term "lateral" herein denotes a direction generally perpendicular to the direction of the transmission line and its electrodes in a plane parallel to the layers of the SOI substrate.) Compared with some conventional approaches for RF loss reduction, which involve either the removal of a large portion of the silicon handle spanning multiple photonic devices and leaving, in some instances, only a narrow rim of the handle, or the etching of channels extending through the cladding, silicon device layers, and BOX layers of the SOI substrate, the present approach involves the removal of much smaller amounts of material, resulting in better mechanical durability and ease of handling of the PIC while still achieving the purpose of breaking the parasitic conduction layer so as to reduce RF losses. In some embodiments, the channels are wholly within the region directly underneath the gap and do not overlap laterally with the electrodes defining the gap; in some embodiments, the channels are even narrower in width than the gap and do not even extend to the inner edges of the electrodes. The gaps, and thus the channels if no wider than the gaps, may have widths between about 5 µm and about 100 µm. PICs with such narrow channels can be made, e.g., by minimally etching the upper silicon device layer and/or etching the silicon handle using back-side trenches or back-side vias. The etched channels may be filled with a nonconductive polymer or dielectric material, or left air-filled.

In accordance with various embodiments, a photonic integrated circuit (PIC) may include a silicon-on-insulator substrate including a silicon handle, a buried oxide layer disposed on top of the silicon handle, a silicon device layer disposed on top of the buried oxide layer, and a cladding layer disposed on top of the silicon device layer, and, formed partially within the silicon device layer and/or the cladding layer, a plurality of photonic devices. (A device is herein understood to be "formed partially within" a layer if one or more of the structures of the device are embedded in the layer and/or created by removal of material from the layer. For example, a device structure may be etched into the silicon device layer, or created from III-V material embedded within the cladding layer.) One of the photonic devices includes a transmission line having two or more electrodes disposed on top of the cladding layer, the two or more electrodes defining one or more gaps between adjacent ones of the electrodes. One or more nonconductive channels each laterally at least partially overlapping with one of the one or more gaps and not extending beyond outer edges of the electrodes defining the respective gap are formed within the silicon handle and/or the silicon device layer. (The device including the transmission line and having one or more nonconductive channels laterally overlapping with the gap(s) between the electrodes of the transmission line is herein also referred to as the "first photonic device," to distinguish it from one or more other devices contained in the same PIC, referred to as "one or more second photonic devices," which may, but need not, include transmission lines and, even if they include transmission lines, need not have nonconductive channels formed underneath. In general, if a PIC includes multiple photonic devices with RF transmission lines, RF losses may be reduced in any one or more of them by forming nonconductive channels in the silicon handle and/or the silicon device layer as described herein.)

Various example embodiments will now be described in more detail with reference to the accompanying drawings. Numerous specific features and details mentioned in the following description do not apply to, and not to be read into, each and every embodiment of the disclosed subject matter, but merely serve the purpose of better illustration and explanation.

With reference to FIGS. 2 and 3A-3E, the principles of the presently disclosed subject matter are illustrated for an example PIC including a Mach-Zehnder modulator, among other photonic devices. A Mach-Zehnder modulator is an optical device (usually referred to as a "photonic device" if implemented in semiconductor) that serves to control the amplitude of an optical signal via an applied electrical signal. The Mach-Zehnder modulator generally includes an optical waveguide branching out into two interferometric waveguide arms that re-combine at the other end, and a transmission line with at least two electrodes to create an electrical field across the waveguide arms that imparts a relative phase shift between optical signals travelling through the two waveguide arms.

Figure 2:
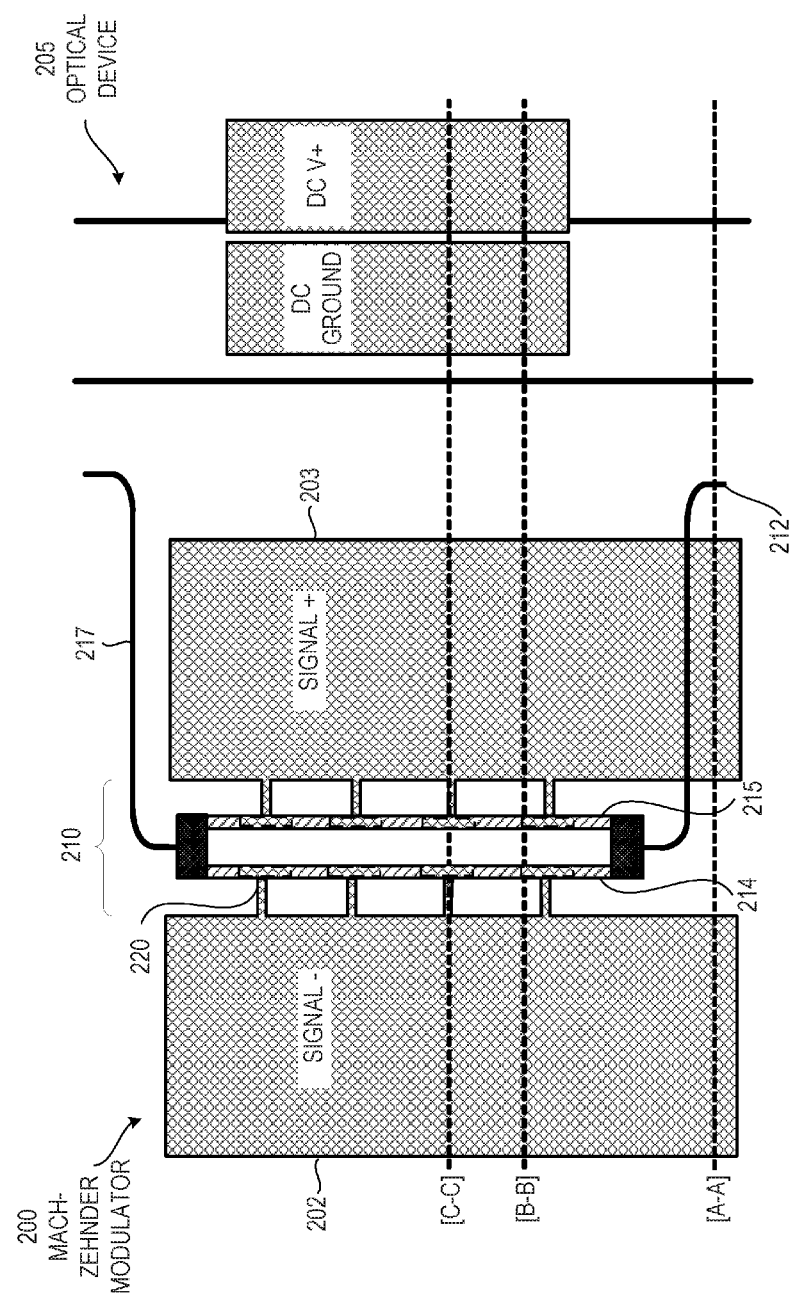
FIG. 2 is a top view of a portion of an example PIC comprising an example Mach-Zehnder modulator with two electrodes, in accordance with one embodiment.

FIG. 2 is a top view of a portion of an example PIC including an example Mach-Zehnder modulator 200 with two electrodes, 202, 203, in accordance with one embodiment. To illustrate that the Mach-Zehnder modulator 200 is only one among multiple photonic devices within the PIC, the depicted portion also shows a second device 205, which includes a waveguide and two electrodes.

Returning to the description of the Mach-Zehnder modulator 200, the two electrodes 202, 203 carry opposite polarity of the otherwise same electrical signal so as to create an electrical field extending from one electrode 203 to the other electrode 202. In the gap 210 formed between the two electrodes 202, 203, an incoming optical waveguide 212 splits into two interferometric waveguide arms 214, 215, which are then recombined into an outgoing waveguide 217. (While shown as running along the entire length of the waveguide arms 214, 215 and including the points of splitting and recombination, the electrodes 202, 203 may, alternatively, be shorter so as to extend along only a portion of the waveguide arms 214, 215.) The waveguide arms 214, 215 may be formed, at least partially, in a different layer of the SOI substrate than the incoming and outgoing waveguides 212, 217, as indicated through different shadings and further illustrated in FIG. 3B. For example, the waveguide arms 214, 215 may include III-V structures bonded to the SOI substrate and embedded within the cladding layer 110, which achieve a phase shift between the waveguide arms 214, 215. Each waveguide arm 214, 215 is electrically connected to the adjacent electrode 202, 203 via one or more (e.g., four, as shown) electrical contacts 220. As shown, the electrical contacts 220 may be T-shaped, with a narrow bridge extending from the electrode 202 or 203 to the respective waveguide arm 214 or 215 and a contact trace disposed directly on top of and running along a portion of the waveguide arm 214 or 215. Note that, for purposes of clearly describing the relative position and extent of the channels formed in the SOI substrate and the electrodes of the RF transmission line, the electrical contacts 220 are deemed not part of the electrodes 202, 203.

Figure 3A:
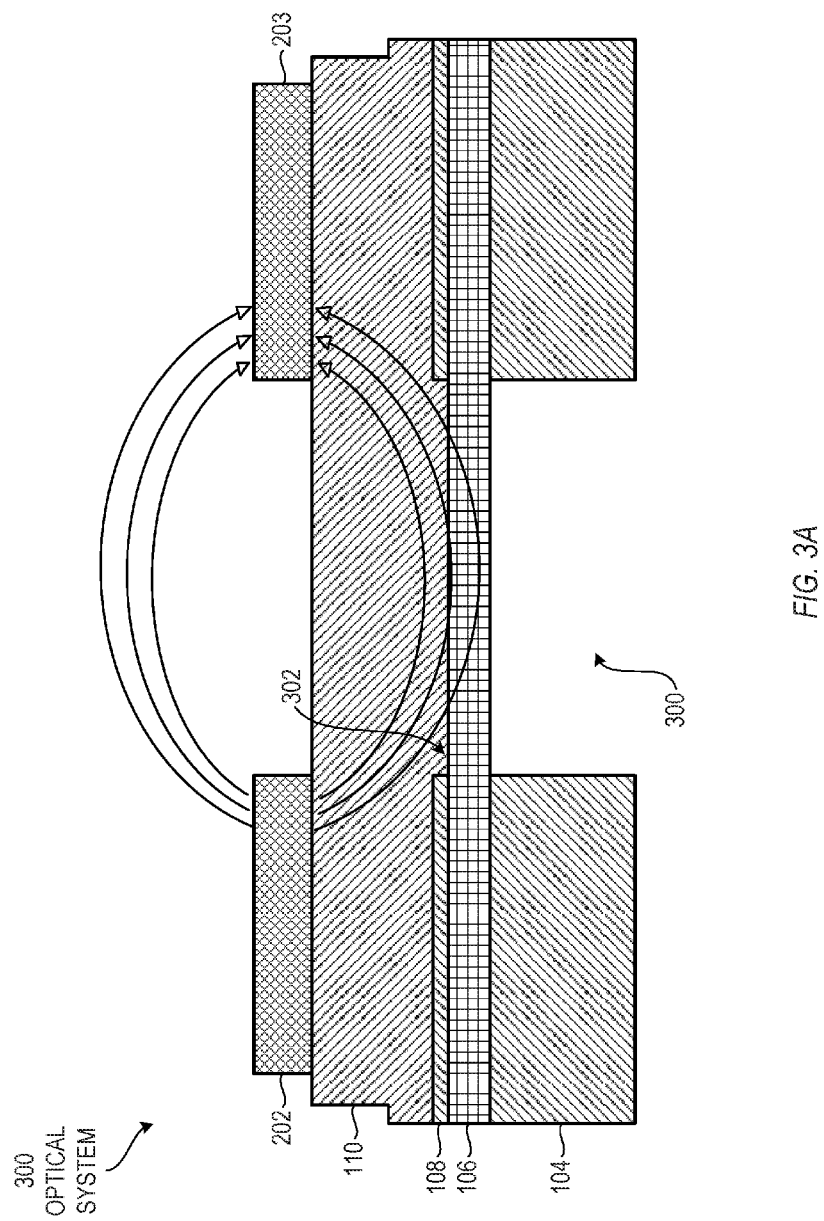
FIGS. 3A-3C are cross-sectional views of the example Mach-Zehnder modulator of FIG. 2 as implemented on an SOI substrate having a channel formed in the silicon handle, in accordance with one embodiment.
Figure 3B:
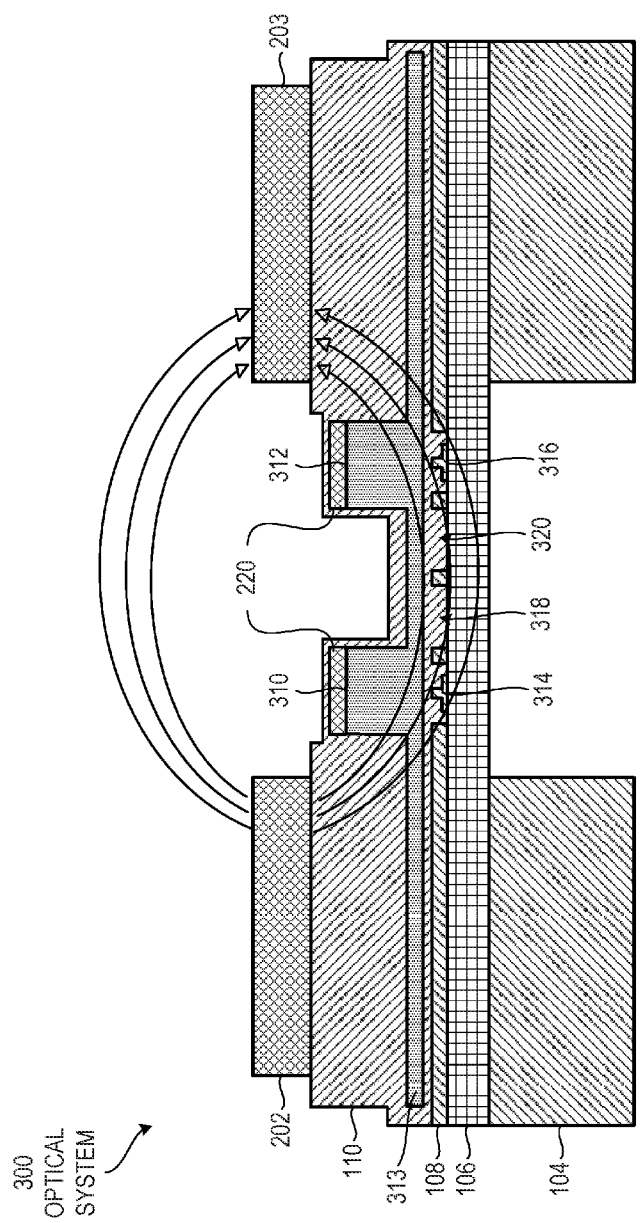
Figure 3C:
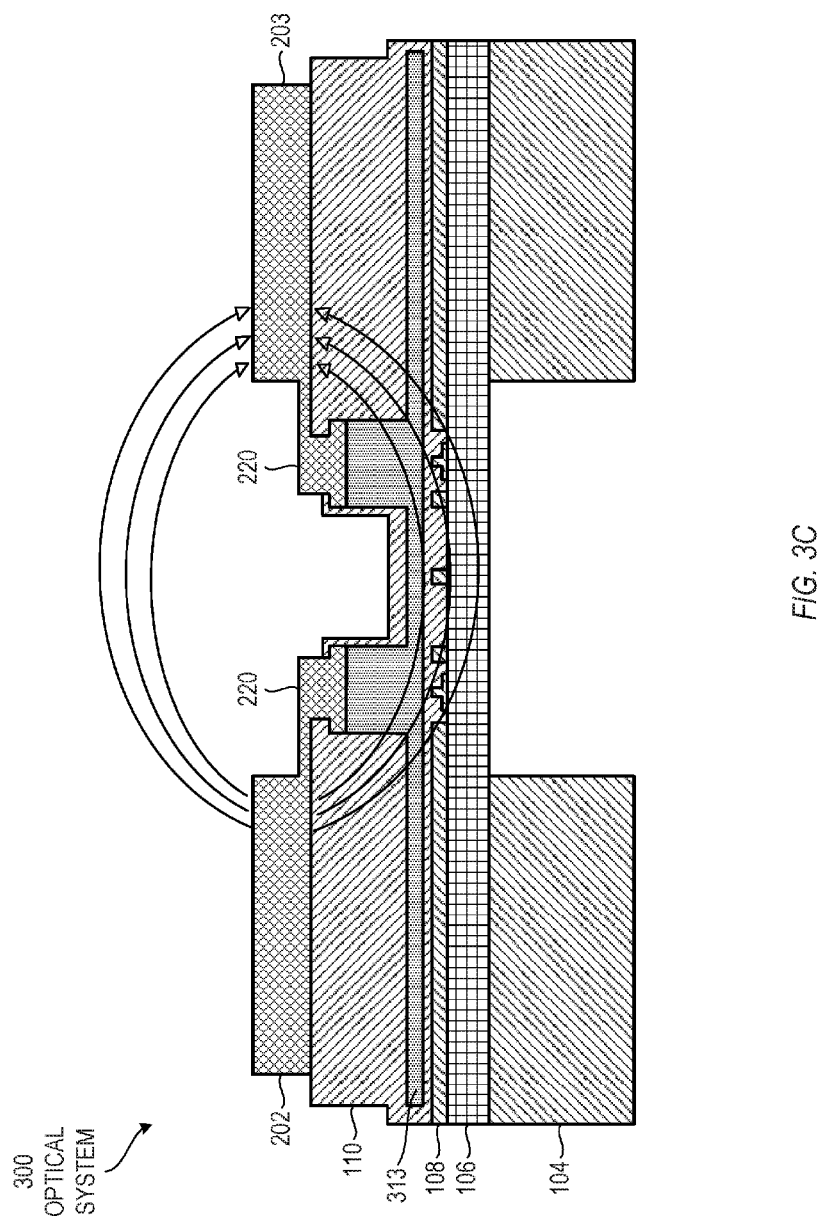

FIGS. 3A-3C are cross-sectional views of the example Mach-Zehnder modulator of FIG. 2, taken through the SOI substrate in which the Mach-Zehnder modulator is implemented along three lines marked [A-A], [B-B], and [C-C] in FIG. 2. The first cross-section, along line [A-A], is taken at a position along the electrodes 202, 203 where it does not intersect the waveguide structure (in particular, waveguide arms 214 or 215) between the electrodes 202, 203. In the depicted embodiment, as can be seen in FIG. 3A, silicon has been removed from both the silicon handle 104 and the silicon device layer 108 in a region directly underneath and laterally coextensive with the gap 210 between the electrodes 202, 203 to form channels 300, 302 within the silicon handle 104 and silicon device layer 108, respectively (the channels extending into the plane of FIG. 3A). The channel 302 in the silicon device layer 108 is filled with the cladding material (as a result of the manufacturing process in accordance with one embodiment). The channel 300 may remain unfilled (that is, air-filled).

FIG. 3B shows the cross-section along [B-B] through the interferometric waveguide arms 214, 215. In this embodiment, the waveguide arms 214, 215 are formed largely within the cladding layer 110, as III-V waveguides 310, 312 extending from an embedded layer 313 of III-V semiconductor material. The waveguide arms 214, 215 may also be implemented in part in the silicon device layer 110. For example, as shown, the silicon device layer 110 may be patterned to form channels underneath the III-V waveguides 310, 312 that define therein silicon rib waveguide cores 314, 316 that appear here as an upside down "T" shape. One or more channels 318, 320 formed in the silicon device layer 110 underneath the gap between the III-V waveguides 310, 312 as an extension of channel 300 add to the breaking of the conductive layers. The spatially periodic removal of material from the silicon device layer 110, results in multiple (e.g., two, as shown) channels 318, 320 may serve to achieve a suitable trade-off between providing structural support for the III-V material and minimizing charge build-up and RF losses. The cross-section in FIG. 3B also shows the electrical contact traces (of electrical contacts 220) disposed on top of the III-V waveguides 310, 312, through which the waveguide 310, 312 are connected to the electrodes 202, 203. FIG. 3C further shows, in a cross-section along [C-C], the contact bridges of the electrical contacts 220 that connect the electrodes 212, 213 to the contact traces.

FIG. 3D is a cross-sectional view of the example Mach-Zehnder modulator of FIG. 2 in accordance with an alternative embodiment, in which the channel 320 formed in the silicon handle 104 is filled with a non-conductive material, such as a non-conductive polymer (e.g., without limitation, polyimide or benzocyclobutene) or a dielectric material (e.g., without limitation, spin-on-glass, $SiO_2$, SiNx, or $Al_2O_3$).

Figure 3E:
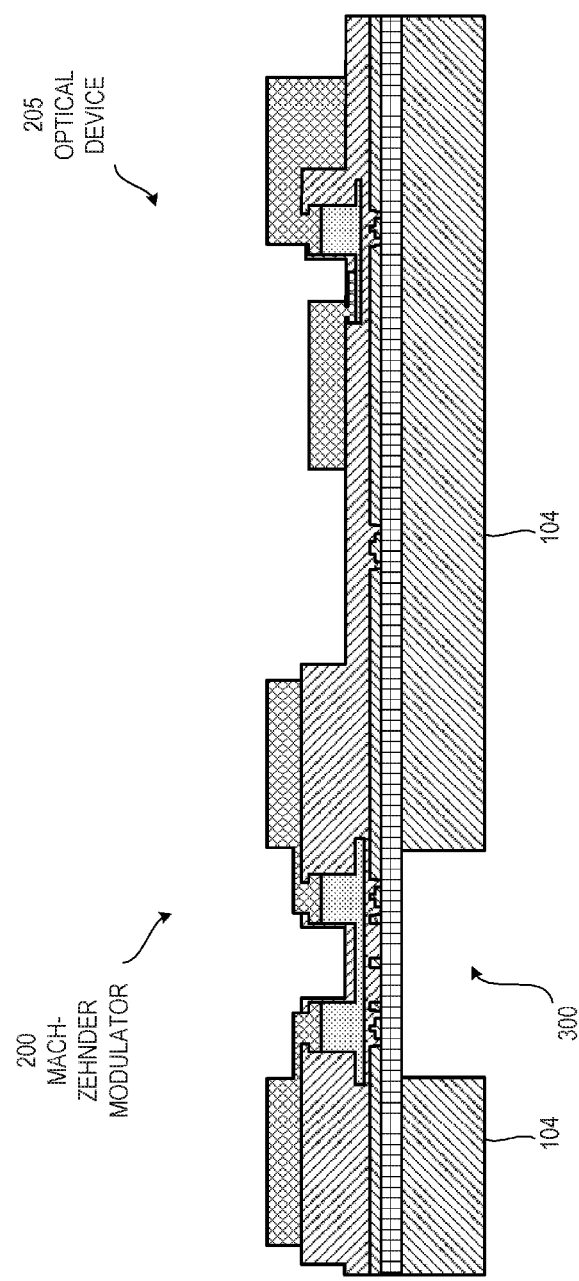
FIG. 3E is a cross-sectional view of the portion of the example PIC of FIG. 2 as implemented on an SOI substrate having a channel formed in the silicon handle, in accordance with one embodiment, illustrating the lateral confinement of the channel to a region underneath a single photonic device.

FIG. 3E is a cross-sectional view, taken along line [C-C], of the entire example PIC portion shown in FIG. 2. In addition to the cross-sectional portion through the Mach-Zehnder modulator (shown in FIG. 3C), FIG. 3E also includes a cross-section through the second device 205. In this example embodiment, silicon is removed in the silicon handle 104 only in the region underneath the Mach-Zehnder modulator 200 to form channel 300, but not in the region underneath the second device 205 or in a region between the two devices 200, 205. By limiting, in this manner, silicon removal to one or more channels confined within one or more individual devices subject to RF losses, overall silicon removal from the silicon handle 104 is minimized and the structural support provided by the silicon handle 104 is maintained to the maximum extent while reducing the RF losses.

Non-conductive channels formed in the silicon handle 104 or a silicon device layer 108 underneath transmission lines (including electrodes and gaps between the electrodes) can reduce RF losses in many different structural implementations of Mach-Zehnder modulators as well as in various other types of photonic devices, the structure depicted in FIGS. 2 and 3A-3D being just one example. In general, channels breaking parasitic conductive layers, as described herein, may be particularly useful in long (>0.1 mm in length) RF photonic devices implemented in SOI substrates (including, but not limited to, SOI substrates with bonded III-V components).

Further, the possible number of electrodes in a single transmission line is not limited to only two. FIGS. 4A, 4C and 4D, for instance, provide top views of example Mach-Zehnder modulators with three, four, and five electrodes, respectively. The gaps between the electrodes may be between about 1 µm and about 100 µm in width, and the electrodes themselves may have widths between about 2 µm and about 100 µm. In some examples, the impedance of the transmission line formed with the electrodes can match an external RF characteristic impedance between about 25 ohms and about 100 ohms, and most commonly 50 ohms or 75 ohms. Devices with more electrodes tend to be (but are not necessarily) wider overall.

Figure 4B:
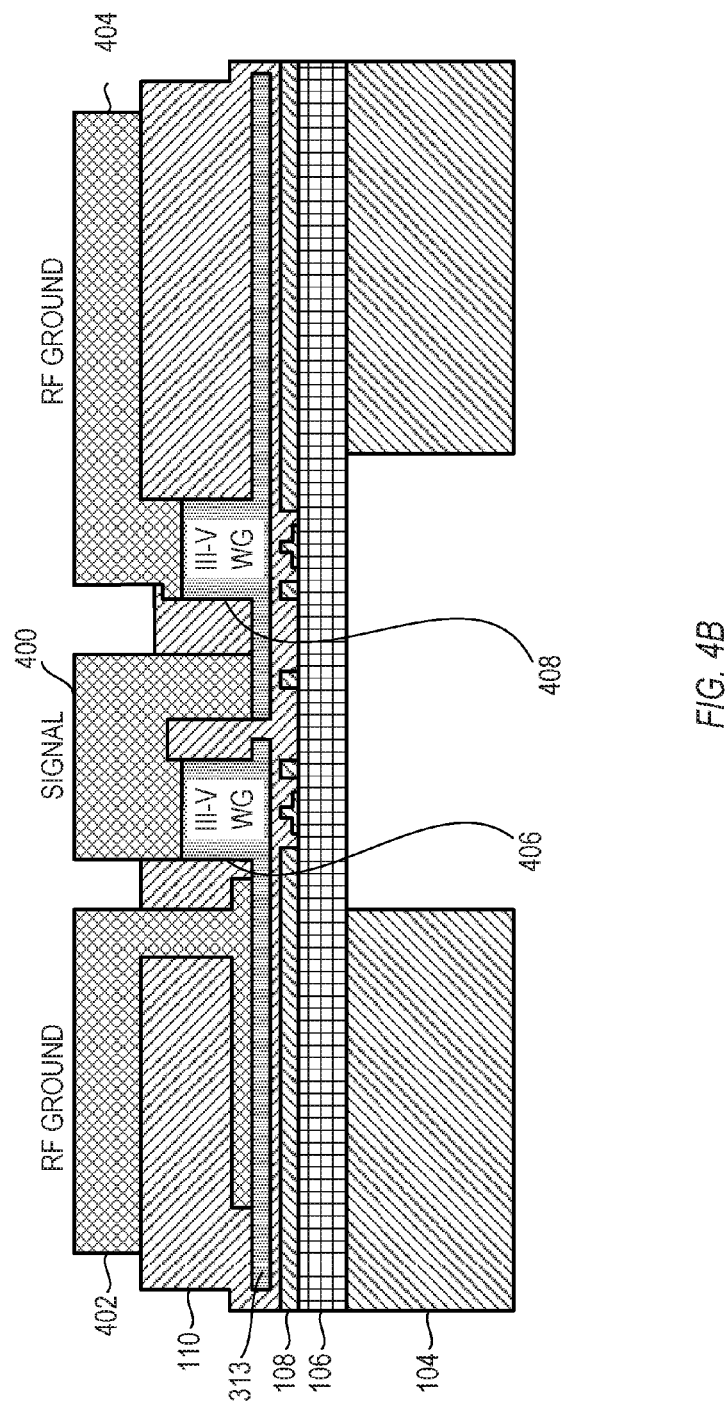
FIG. 4B is a cross-sectional view of the example Mach-Zehnder modulator of FIG. 4A as implemented on an SOI substrate having a channel formed in the silicon handle, in accordance with one embodiment.
Figure 4C:
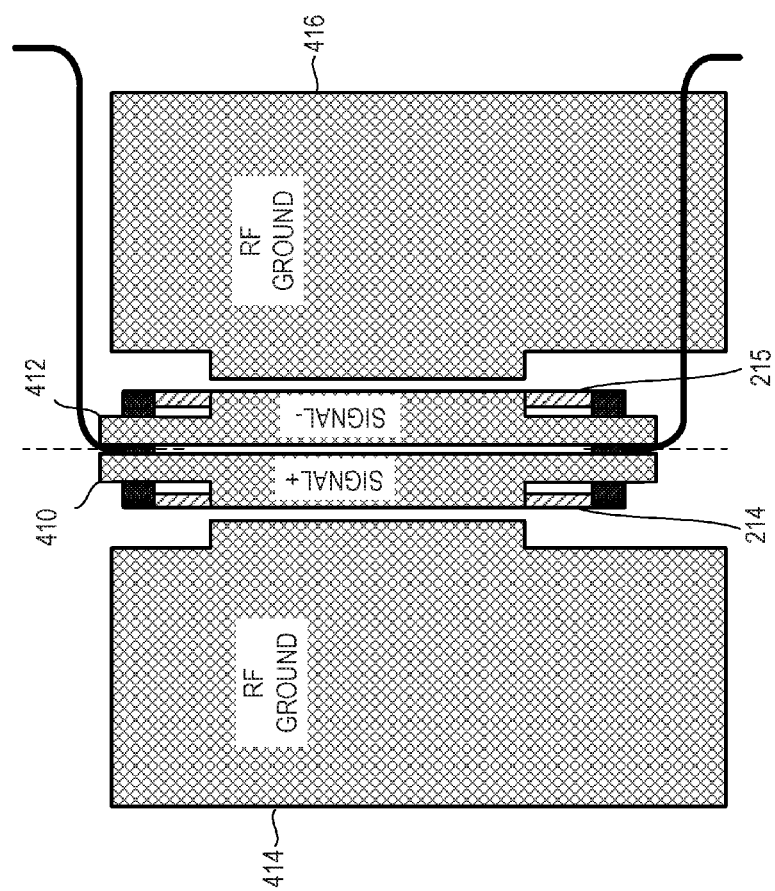
FIGS. 4C and 4D are top views of example Mach-Zehnder modulators with four and five electrodes, respectively, in accordance with various embodiments.
Figure 4D:
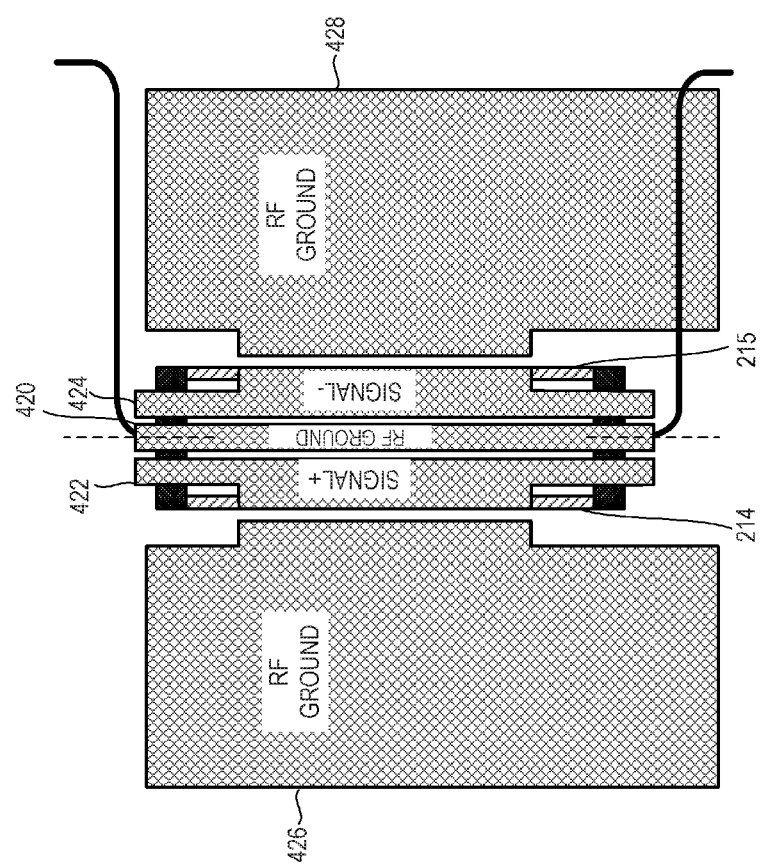

In the embodiment of FIG. 4A, the transmission line includes three electrodes: a central signal electrode 400 flanked by two ground electrodes 402, 404. FIG. 4B is a cross-sectional view of the example Mach-Zehnder modulator of FIG. 4A as implemented on an SOI substrate having a channel formed in the silicon handle, in accordance with one embodiment. As shown, the III-V layer 313 is, in this embodiment, broken between the left and right interferometric waveguide arms 406, 408. As can be seen in FIG. 4A in conjunction with FIG. 4B, the signal electrode 400 is disposed above the waveguide structure and electrically connected to the top portion of the left interferometric waveguide arm 406 and the bottom portion of the right interferometric arm 408. The right ground electrode 404 is connected to the top portion of the right interferometric waveguide arm 408 and the left ground electrode 402 is connected to the bottom portion of the left interferometric arm 406. To avoid RF losses in the depicted device, channels may be formed underneath the gaps between the signal electrode 400 and each of ground electrodes 402, 404.

In the embodiment of FIG. 4B, a Mach-Zehnder modulator with a transmission line having four electrodes is shown. In the center of the transmission line, two signal electrodes 410, 412 of opposite polarity are disposed above and electrically connected to the two interferometric waveguide arms 214, 215. The signal electrodes 410, 412 are flanked by two ground electrodes 414, 416. Here, channels may be formed in the silicon handle and/or silicon device layer underneath the gap between the two signal electrodes 410, 412 or the gaps between each signal electrode and its adjacent ground electrode (e.g., between signal electrode 410 and ground electrode 414 and/or between signal electrode 412 and ground electrode 416).

In the embodiment of FIG. 4C, a Mach-Zehnder modulator with a transmission line having five electrodes is shown. Compared with the transmission line of FIG. 4D, an additional ground electrode 420 is added between the two signal electrodes 422, 424 of opposite polarity. The five electrodes 426, 422, 420, 424, 428 define four gaps between adjacent electrodes. More particularly, a gap is defined between the signal electrode 422 and each of its adjacent ground electrodes 426, 420 and between the signal electrode 424 and each of its adjacent ground electrodes 420, 428. Channels that break the parasitic conductive layers may be formed in the region under each of the gaps (possibly partially overlapping with the electrodes defining the gap).

As an example of a different type of photonic device that may benefit from RF loss reduction in accordance herewith, FIG. 5 shows a top view of an example traveling-wave photodetector including an optical waveguide 500 and two electrodes 502, 504 of opposite polarity (as described, e.g., in U.S. Pat. No. 5,270,532 and U.S. Patent Application Publication No. 2010/0327382). This device is used for photodetection via an RF signal that is generated on the electrodes by the absorbed light. A single waveguide brings light into a long photoabsorption region (e.g., between about 0.1 mm and 10 mm in length) where the light is gradually absorbed and an RF signal is generated on the electrodes. To preserve the RF signal, it is beneficial to reduce the optical losses. The waveguide 500, which may be a III-V structure bonded to an SOI substrate, receives optical inputs from a waveguide 506 in the silicon device layer. An electrical signal is generated as the optical signal is absorbed. To reduce RF losses in this device, one or more channels may be formed in the silicon device layer 108 or silicon handle 104 in a region laterally overlapping with the gap between the electrodes 502, 504.

Figure 6:
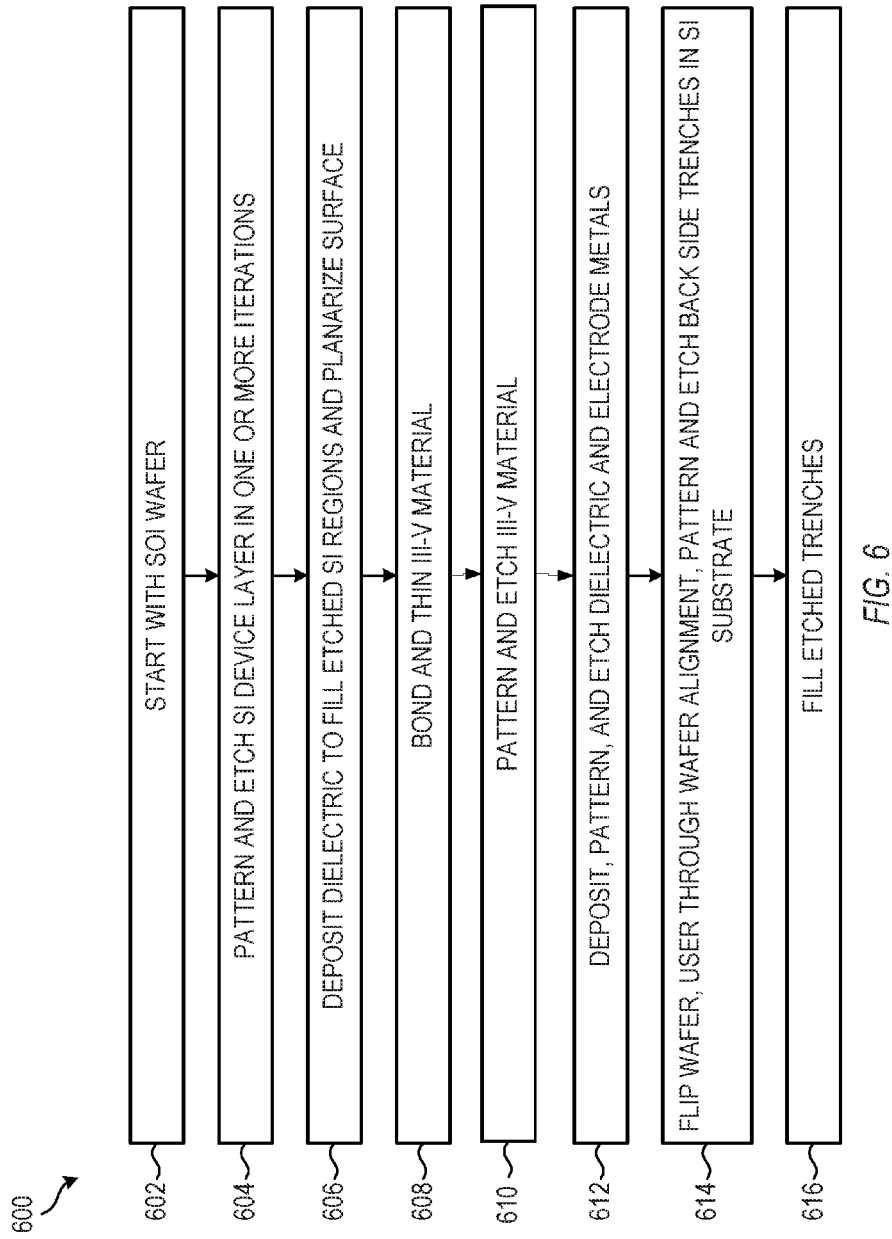
FIG. 6 is a flow chart of an example method of fabricating an SOI substrate having one or more channels formed therein, in accordance with various embodiments.

FIG. 6 is a flow chart of an example method 600 of fabricating an SOI substrate having one or more channels formed therein, in accordance with various embodiments. Throughout the method 600, various photolithographic patterning and etching operations are performed using conventional techniques well-known to those of ordinary skill in the art. The method begins, at 602, with providing an SOI wafer, which includes a silicon handle 104, BOX layer 106, and silicon device layer 108 (as yet without any devices) as depicted, e.g., in FIG. 1. In operation 604, the silicon device layer 108 is patterned and etched, in one or more iterations, to form photonic device components (e.g., optical waveguides) and/or conductivity-breaking channels. For example, to create the structure shown in FIG. 3B, the silicon device layer 108 is first patterned and partially etched to form the upper portion of the rib waveguide 314, which looks like an upside down "T", and then patterned again and etched down to the box layer 106 to form the lower portion of the rib waveguide as well as any device components (such as, e.g., waveguide cores 314, 316) and conductivity-breaking channels (e.g., channels 302, 318, 320) therein. Next, a dielectric material is deposited on top of the etched silicon device layer 108 to fill in the etched regions, and the surface is planarized (operation 606). In some embodiments, in operation 608, III-V material is bonded to the patterned SOI substrate and thinned to reduce the III-V material thickness after bonding. To create the III-V device components (e.g., with reference to FIG. 3B, the III-V waveguides 310, 312 that form the interferometric waveguide arms of the Mach-Zehnder modulator), the bonded III-V material is patterned and etched (operation 610). Further, to create the electrodes of the transmission lines (e.g., with reference to FIG. 2, electrodes 202, 203) and associated electrical contacts (e.g., contacts 220) and thin and thick dielectrics (e.g., of cladding layer 110), dielectric materials and electrode metals are then deposited, patterned, and etched in a series of steps (operation 612). To form conductivity-breaking channels in the silicon handle 104, the patterned wafer is flipped and aligned (e.g., by through-wafer-alignment, wherein alignment features on the top surface are used to position a photolithography mask precisely relative to the wafer backside), and then back-side trenches are patterned and etched into the silicon handle 104 (operation 614). Optionally, the back-side trenches may be filled with a non-conductive polymer or dielectric (operation 616).

Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This description, therefore, is not to be taken in a limiting sense, and the scope of various embodiments is defined only by the appended claims, along with the full range of equivalents to which such claims are entitled.

The invention claimed is:

1. A photonic integrated circuit (PIC) comprising:
   a silicon-on-insulator substrate comprising a silicon handle, a buried oxide layer disposed on top of the silicon handle, a silicon device layer disposed on top of the buried oxide layer, and a cladding layer disposed on top of the silicon device layer;
   a first photonic device comprising a device structure made of a material embedded within the cladding layer and a transmission line having two or more electrodes disposed on top of the cladding layer, the two or more electrodes defining one or more gaps between the electrodes;
   one or more second photonic devices formed partially within at least one of the silicon device layer or the cladding layer; and
   formed within at least one of the silicon handle or the silicon device layer in a region underneath the transmission line, one or more nonconductive channels each laterally overlapping with one of the one or more gaps and not extending beyond outer edges of the electrodes defining the respective gap.

2. The PIC of claim 1, wherein the first photonic device is a Mach-Zehnder modulator comprising two waveguide interferometer arms formed of the material.

3. The PIC of claim 1, wherein the one or more channels underneath the one or more gaps do not laterally overlap with the electrodes defining the respective gaps.

4. The PIC of claim 1, wherein at least one of the nonconductive channels is formed within the silicon device layer.

5. The PIC of claim 1, wherein at least one of the nonconductive channels is formed within the silicon handle.

* * * * *